(12) United States Patent
Aoya et al.

(10) Patent No.: US 10,879,144 B2
(45) Date of Patent: Dec. 29, 2020

(54) SEMICONDUCTOR PACKAGE WITH MULTILAYER MOLD

(71) Applicant: TEXAS INSTRUMENTS INCORPORATED, Dallas, TX (US)

(72) Inventors: Kengo Aoya, Oita (JP); Masamitsu Matsuura, Oita (JP); Takeshi Onogami, Oita (JP); Hideaki Matsunaga, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/540,943

(22) Filed: Aug. 14, 2019

(65) Prior Publication Data
US 2020/0058570 A1    Feb. 20, 2020

Related U.S. Application Data

(60) Provisional application No. 62/718,510, filed on Aug. 14, 2018, provisional application No. 62/718,533, (Continued)

(51) Int. Cl.
| | |
|---|---|
| *H01L 23/16* | (2006.01) |
| *H01L 23/31* | (2006.01) |
| *H01L 23/498* | (2006.01) |
| *H01L 23/053* | (2006.01) |
| *H01L 21/56* | (2006.01) |

(Continued)

(52) U.S. Cl.
CPC ........ *H01L 23/3128* (2013.01); *H01L 21/568* (2013.01); *H01L 21/78* (2013.01); *H01L 23/053* (2013.01); *H01L 23/16* (2013.01); *H01L 23/3135* (2013.01); *H01L 23/49822* (2013.01);
(Continued)

(58) Field of Classification Search
CPC ..... H01L 23/053; H01L 23/16; H01L 23/562; H01L 23/3128; H01L 23/3135; H01L 23/49822; H01L 23/49838
See application file for complete search history.

(56) References Cited

U.S. PATENT DOCUMENTS

| | | |
|---|---|---|
| 4,463,059 A | 7/1984 | Bhattacharya et al. |
| 5,422,514 A | 6/1995 | Griswold et al. |

(Continued)

FOREIGN PATENT DOCUMENTS

RU    2193260 C1    11/2002

*Primary Examiner* — Peniel M Gumedzoe
(74) *Attorney, Agent, or Firm* — Dawn Jos; Charles A. Brill; Frank D. Cimino

(57) ABSTRACT

A semiconductor package includes a semiconductor die including an active side, a redistribution layer over the active side of the semiconductor die, the redistribution layer including metal traces electrically connecting die pads on the active side of the semiconductor die to electrical contacts on an external surface of the semiconductor package, and a layered mold covering the semiconductor die opposite the redistribution layer. The layered mold includes a first resin layer adjacent to the redistribution layer, a fiber layer adjacent to the first resin layer and opposite the redistribution layer, and a second resin layer adjacent to the fiber layer and opposite the redistribution layer. A coefficient of thermal expansion (CTE) of the first resin layer is substantially different than a CTE of the second resin layer.

17 Claims, 12 Drawing Sheets

Related U.S. Application Data filed on Aug. 14, 2018, provisional application No. 62/779,325, filed on Dec. 13, 2018.

(51) Int. Cl.
*H01L 21/78* (2006.01)
*H01L 23/00* (2006.01)

(52) U.S. Cl.
CPC ...... *H01L 23/49838* (2013.01); *H01L 23/562* (2013.01)

(56) References Cited

U.S. PATENT DOCUMENTS

| | | | |
|---|---|---|---|
| 5,907,477 | A | 5/1999 | Tuttle et al. |
| 6,191,951 | B1 | 2/2001 | Houdeau et al. |
| 6,225,703 | B1 | 5/2001 | Umehara et al. |
| 6,247,229 | B1 | 6/2001 | Glenn |
| 6,271,469 | B1 | 8/2001 | Ma et al. |
| 6,753,616 | B2 | 6/2004 | Coyle |
| 6,900,534 | B2 | 5/2005 | Murtuza |
| 7,101,620 | B1 | 9/2006 | Poddar et al. |
| 7,244,636 | B2 | 7/2007 | Ancheta et al. |
| 7,253,022 | B2 | 8/2007 | Khng et al. |
| 7,491,625 | B2 | 2/2009 | Bayan et al. |
| 7,544,541 | B2 | 6/2009 | Low et al. |
| 8,237,257 | B2 | 8/2012 | Yang |
| 8,266,796 | B2 | 9/2012 | Park et al. |
| 8,294,280 | B2 | 10/2012 | Chandrasekaran |
| 8,304,285 | B2 | 11/2012 | Gerber et al. |
| 8,334,174 | B2 | 12/2012 | Chang et al. |
| 8,372,666 | B2 | 2/2013 | Crawford et al. |
| 8,525,341 | B2 * | 9/2013 | Kim ............... H05K 3/4602 257/762 |
| 8,525,348 | B2 | 9/2013 | Chang et al. |
| 8,742,603 | B2 | 6/2014 | Bchir et al. |
| 8,796,561 | B1 | 8/2014 | Scanlan et al. |
| 8,796,867 | B2 | 8/2014 | Hsiao et al. |
| 9,691,726 | B2 | 6/2017 | Cheng et al. |
| 9,875,930 | B2 | 1/2018 | Gallegos et al. |
| 2005/0032989 | A1 | 2/2005 | Onai et al. |
| 2011/0024172 | A1 * | 2/2011 | Maruyama ........ H01L 23/49822 174/258 |
| 2011/0165731 | A1 | 7/2011 | Gerber et al. |
| 2014/0080301 | A1 | 3/2014 | Kirkpatrick et al. |
| 2015/0008566 | A1 | 1/2015 | Gerber et al. |

\* cited by examiner

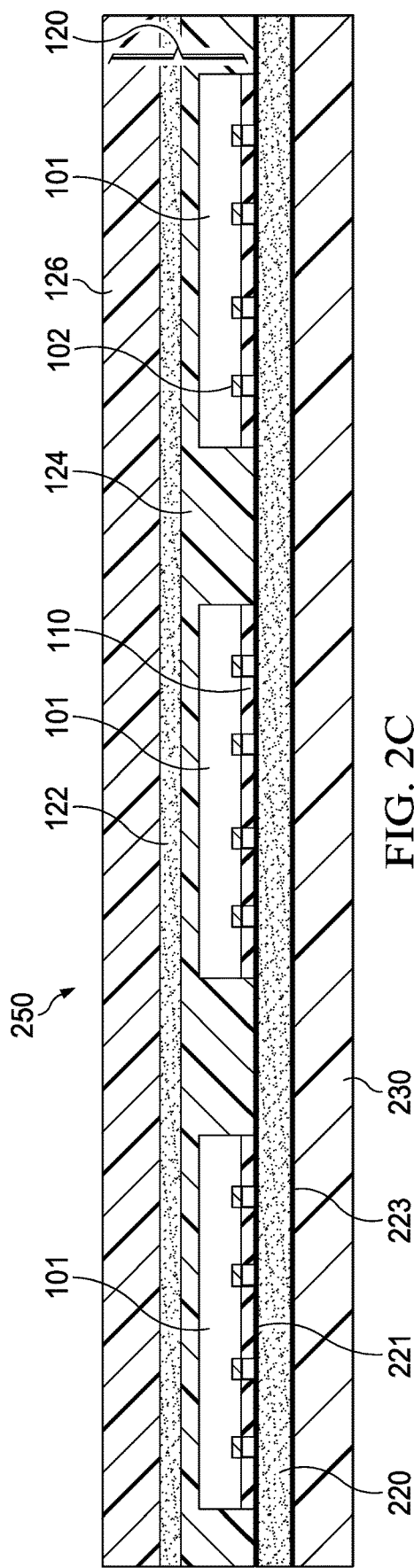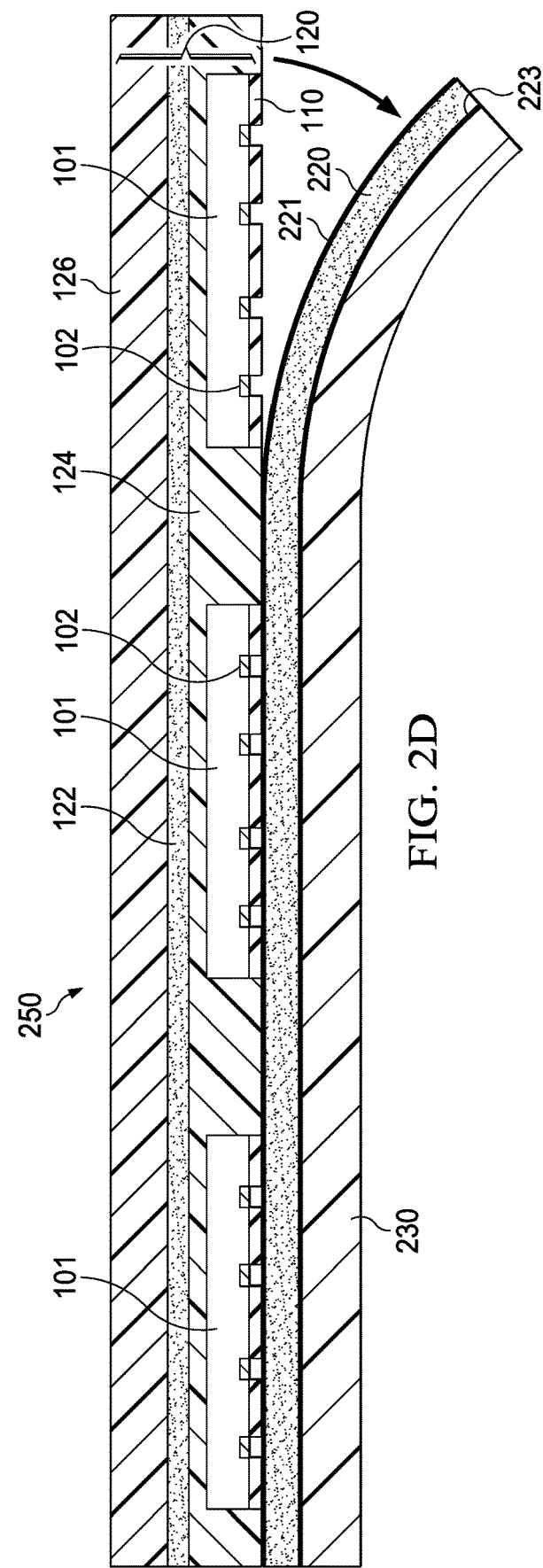

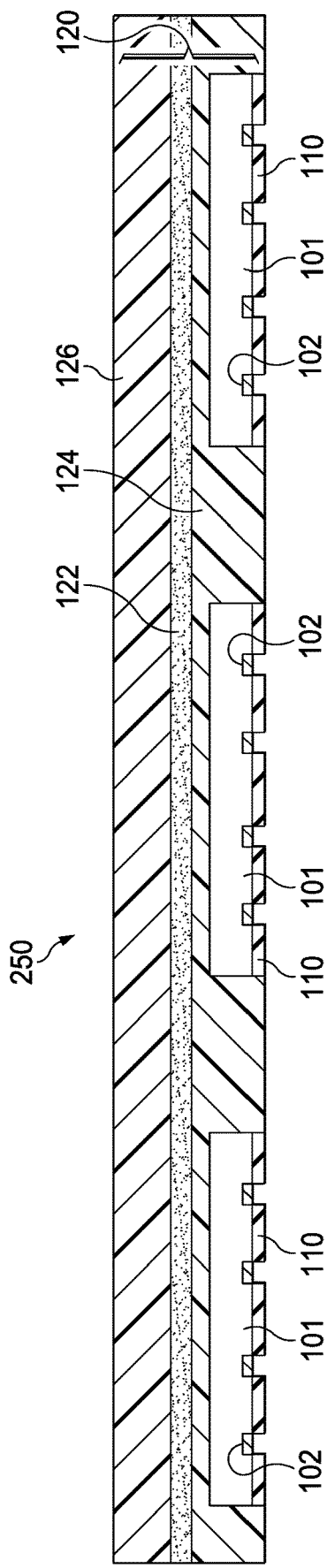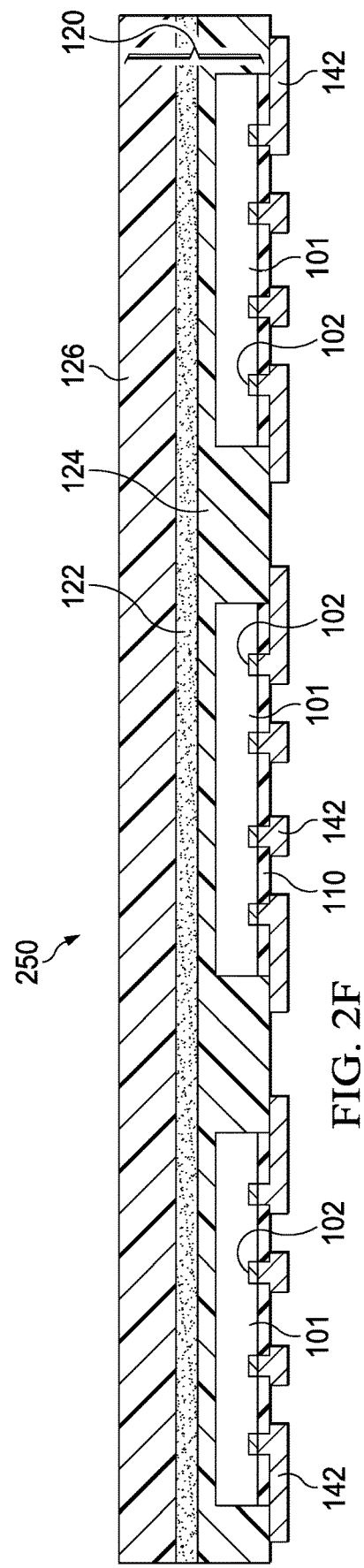

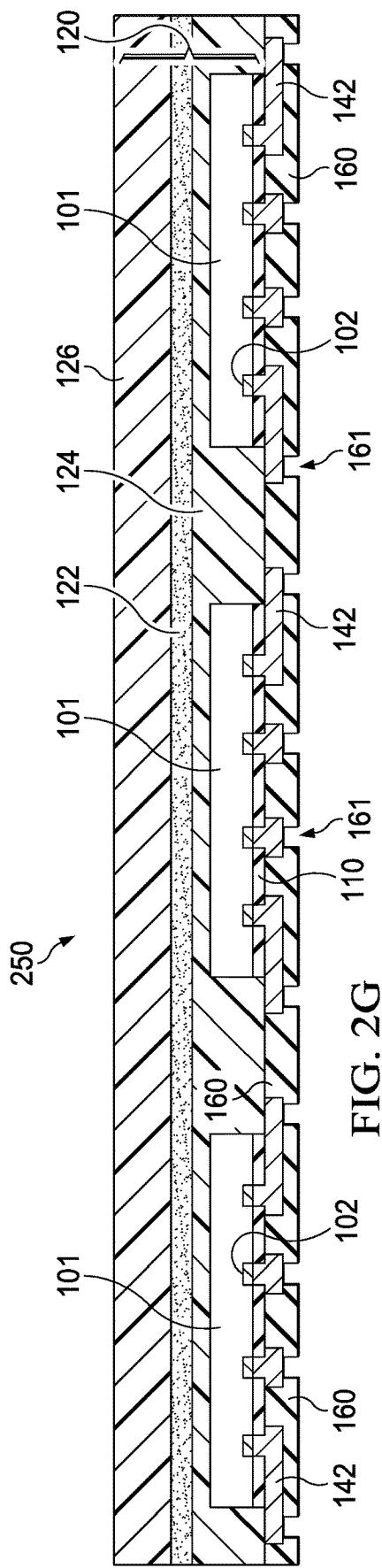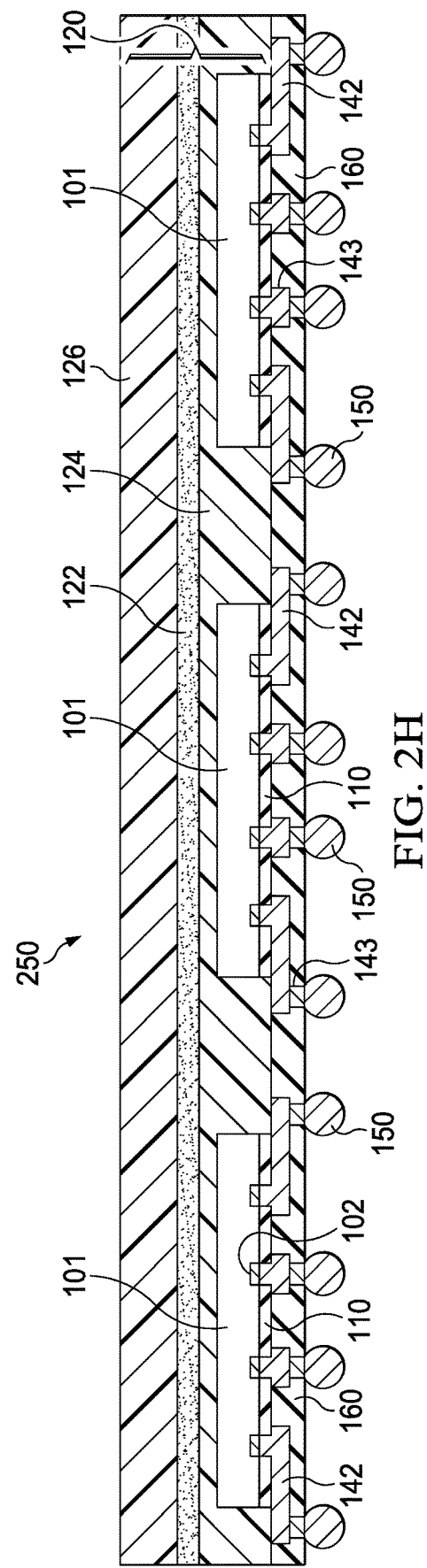

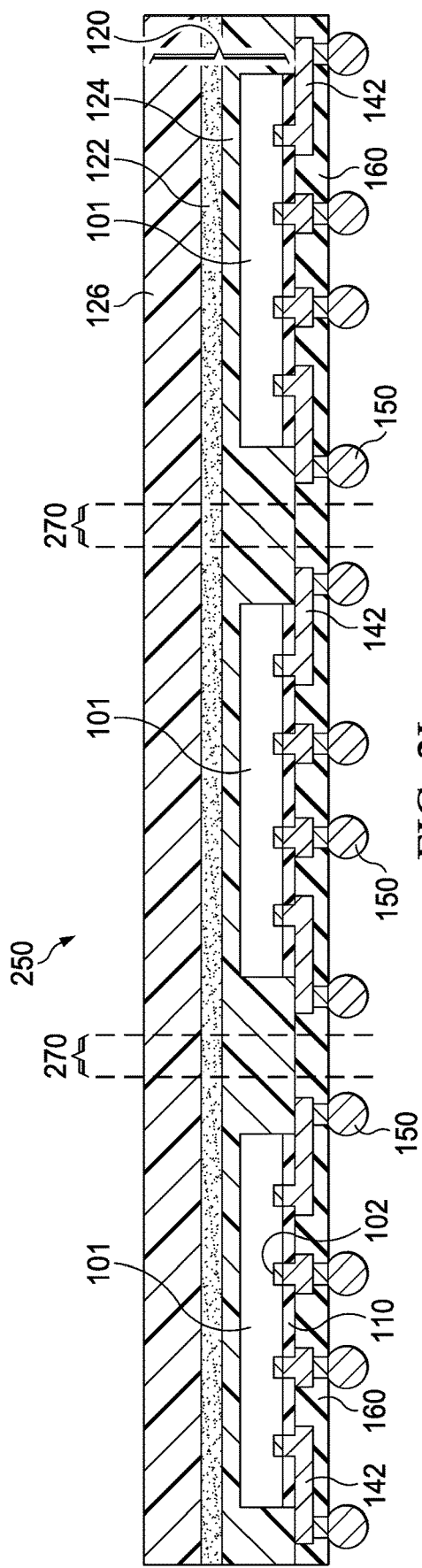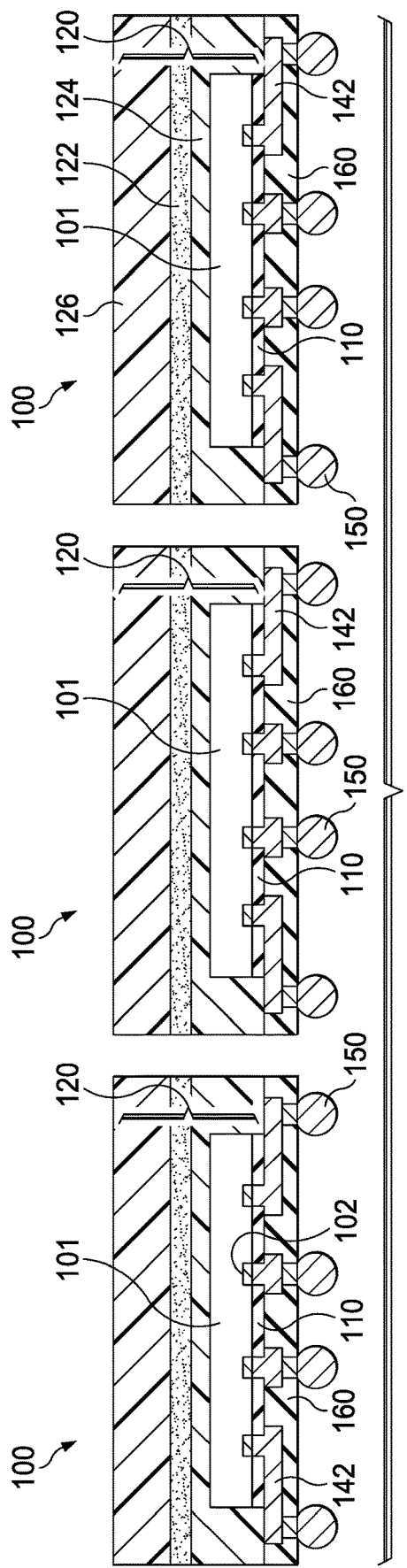
FIG. 2I
FIG. 2J

SEMICONDUCTOR PACKAGE WITH MULTILAYER MOLD

This application claims the benefit of and priority to U.S. Provisional Application No. 62/718,510, filed Aug. 14, 2018, further claims the benefit of and priority to U.S. Provisional Application No. 62/718,533, filed Aug. 14, 2018, and further claims the benefit of and priority to U.S. Provisional Application No. 62/779,325, filed Dec. 13, 2018. Each these applications are hereby fully incorporated herein by reference.

TECHNICAL FIELD

This disclosure relates to semiconductor packages.

BACKGROUND

Semiconductor devices including active and/or passive components may be manufactured into round wafers sliced from elongated cylinder-shaped single crystals of semiconductor elements or compounds. The diameter of these solid-state wafers may reach up 12 inches or more. Individual semiconductor dies are typically singulated from a round wafer by sawing streets in X- and Y-directions through the wafer in order to create rectangularly shaped discrete pieces from the wafers.

Each semiconductor die includes at least one active or passive component and die pads serving to facilitate electric connections to the component(s) of the semiconductor die. Semiconductor dies include many large families of electronic components; examples include active devices such as diodes and transistors like field-effect transistors, passive devices such as resistors and capacitors, and integrated circuits, which can include far more than a million active and passive components.

After singulation, one or more semiconductor dies are attached to a discrete supporting substrate such as a metal leadframe or a rigid multi-level substrate laminated from a plurality of metallic and insulating layers. The conductive traces of the leadframes and substrates are connected to the die pads, typically using bonding wires or metal bumps such as solder bumps.

The assembled semiconductor dies, leadframes and/or substrates may be encapsulated to form discrete robust packages, which frequently employ hardened polymeric compounds and are formed by techniques such as transfer molding. The assembly and packaging processes are performed either on an individual basis or as part of batch processes including a strip or array of semiconductor dies on a corresponding strip or array of leadframes and/or through a single loading of a mold press.

BRIEF SUMMARY

As disclosed herein, a semiconductor package includes a semiconductor die covered with a layered mold. The layered mold includes a fiber layer along a backside of the semiconductor die. The fiber layer separates two resin layers, which have substantially different coefficients of thermal expansion (CTE). For example, the CTE of the resin layer adjacent the semiconductor die may be higher than the CTE of the resin layer on the opposite side of the fiber layer. The compositions of the resin layers may be selected to provide CTEs to mitigate package warpage during manufacturing, installation and operation of the semiconductor package.

As another example, disclosed techniques further include manufacturing process for semiconductor packages. Such techniques utilize a flexible carrier rather than a stiff carrier during manufacturing, which may mitigate stress on the semiconductor packages during removal of the carrier from a molded set of semiconductor packages.

Disclosed techniques may mitigate package warpage during package manufacturing and installation, including, for example, as a result of mechanical stresses from manufacturing processes, and/or thermal expansion and contraction. The disclosed techniques may be particularity applicable to panelized package manufacturing techniques in which a plurality of semiconductor dies are manufactured on a common carrier, such as a carrier of at least 12 inches by 12 inches, as the techniques may mitigate warpage of a panel used in batch processing in addition to mitigating warpage of singulated semiconductor packages. The disclosed techniques may also be particularity applicable to packages without discrete substrates or leadframes, which might otherwise provide rigidity. In various examples, the disclosed techniques are implemented with fan-out packages, fan-in packages, and chip scale packages (CSPs).

In one example, a semiconductor package includes a semiconductor die including an active side, a redistribution layer over the active side of the semiconductor die, the redistribution layer including metal traces electrically connecting die pads on the active side of the semiconductor die to electrical contacts on an external surface of the semiconductor package, and a layered mold covering the semiconductor die opposite the redistribution layer. The layered mold includes a first resin layer adjacent to the redistribution layer, a fiber layer adjacent to the first resin layer and opposite the redistribution layer, and a second resin layer adjacent to the fiber layer and opposite the redistribution layer. A coefficient of thermal expansion (CTE) of the first resin layer is substantially different than a CTE of the second resin layer.

In another example, a method of manufacturing a semiconductor package includes placing an active side of a semiconductor die on an adhesive backed by a flexible carrier to secure the semiconductor die to the flexible carrier, with the semiconductor die secured to the flexible carrier, covering exposed sides of the semiconductor die with a mold compound, curing the mold compound to secure the mold compound to the semiconductor die, peeling the adhesive and the flexible carrier from the die and the cured mold compound to remove the flexible carrier from the semiconductor die and the cured mold compound, and forming a redistribution layer over the active side of the semiconductor die, the redistribution layer including metal traces electrically connecting die pads on the active side of the semiconductor die to electrical contacts on an external surface of the semiconductor package.

BRIEF DESCRIPTION OF THE DRAWINGS

FIGS. 2A-2J are conceptual illustrations of manufacturing steps for a semiconductor package, such as the semiconductor package of FIG. 1A.

DETAILED DESCRIPTION

Figure 1A:
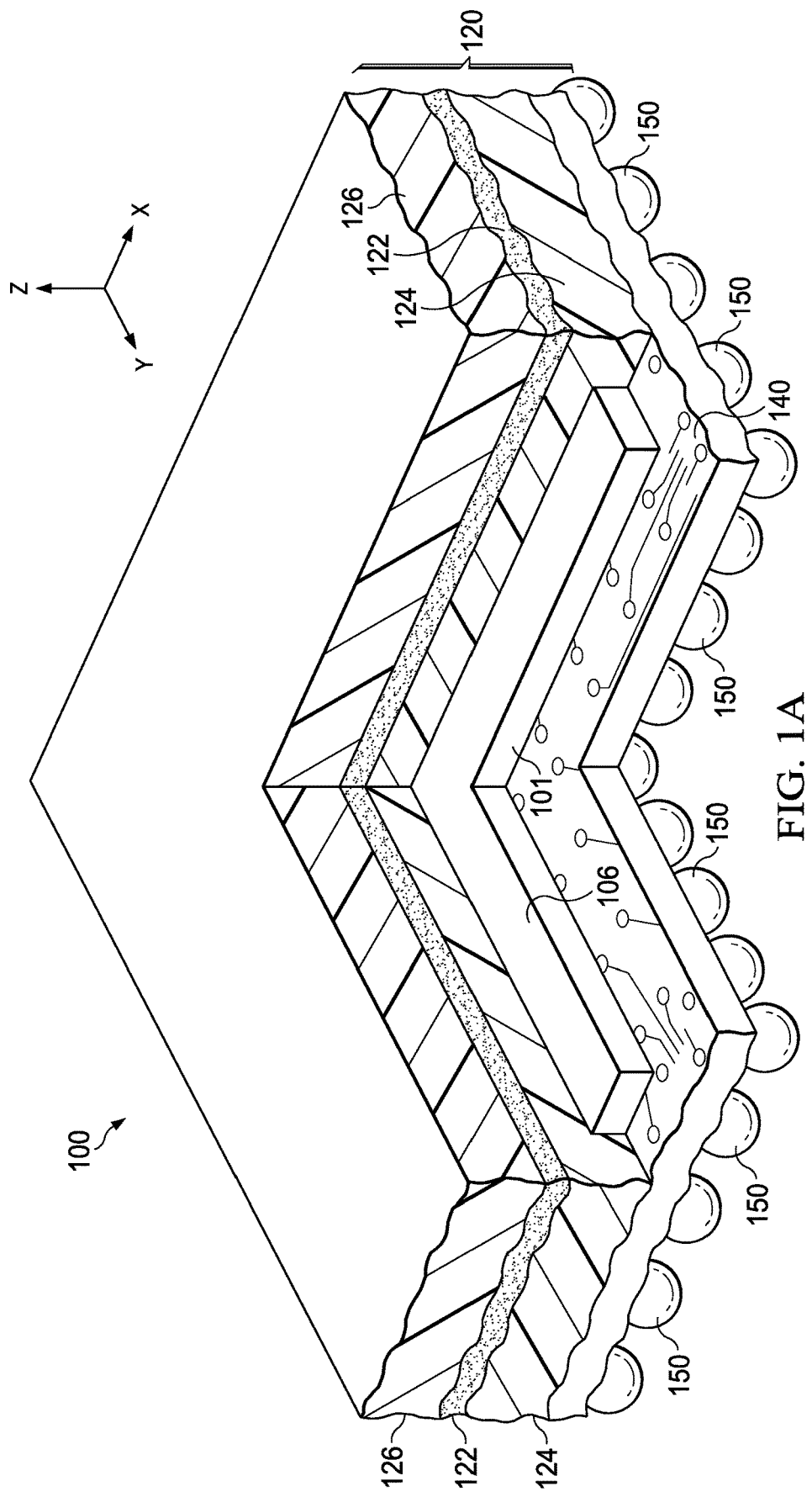
FIG. 1A is a cut-away perspective view of a semiconductor package including a semiconductor die, a redistribution layer over an active side of the semiconductor die, and a layered mold covering the semiconductor die opposite the redistribution layer.
Figure 1B:
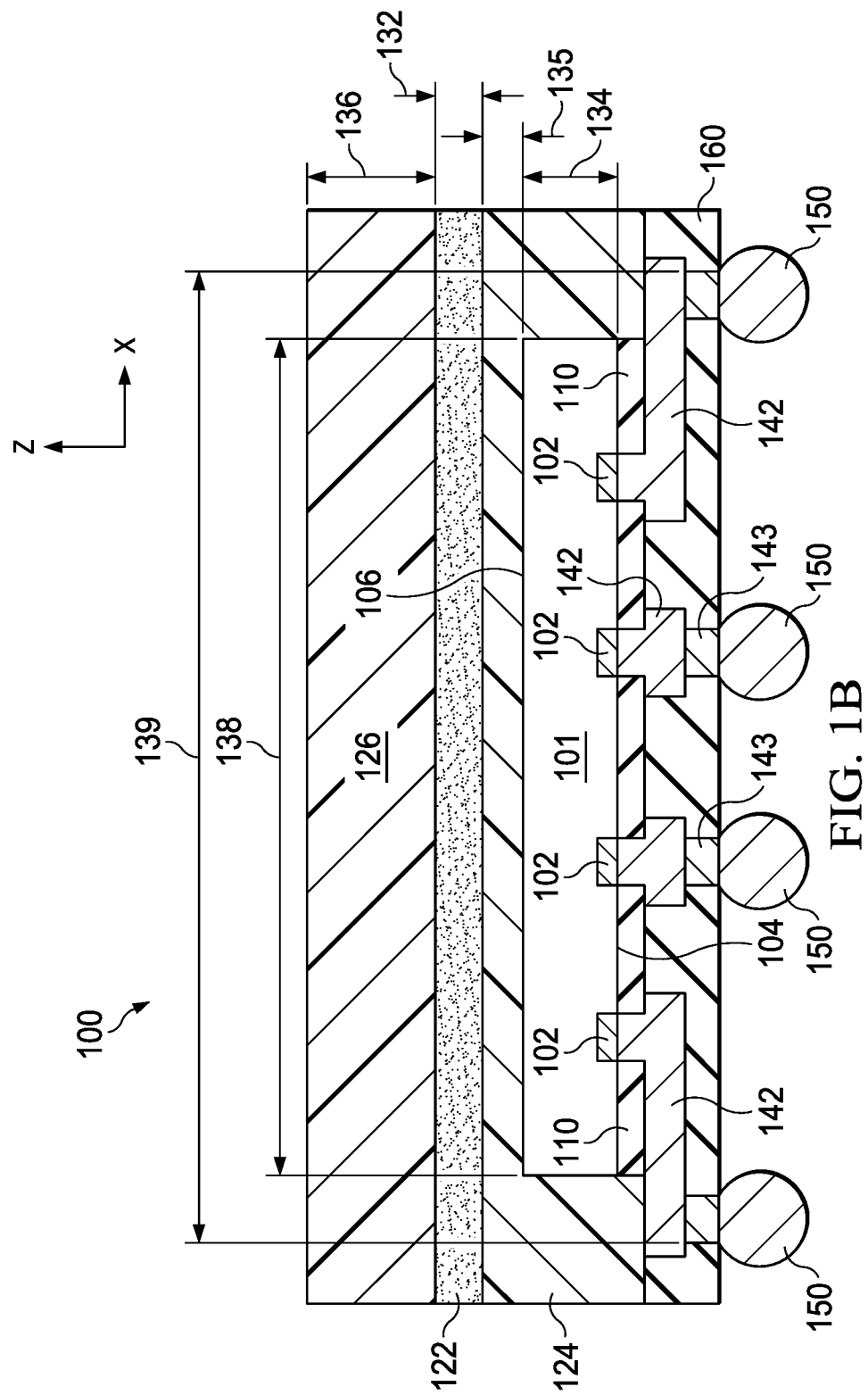
FIG. 1B is a conceptual cross-sectional diagram of the semiconductor package of FIG. 1A.

FIG. 1A is a cut-away perspective view of semiconductor package 100, and FIG. 1B is a cross-sectional diagram of semiconductor package 100. Semiconductor package 100 includes a semiconductor die 101, a redistribution layer 140 over an active side 104 of semiconductor die 101, and a layered mold 120 covering semiconductor die 101 opposite redistribution layer 140. Solder bumps 150 are located on electrical contracts 143 on an external surface of redistribution layer 140. The number of solder bumps 150 on semiconductor package 100 has been reduced for simplicity in FIG. 1B. In some examples, semiconductor die 101 may include an integrated circuit.

As used herein, an active side of a semiconductor die is a side including conductive die pads which serve as terminals to connect the components of the semiconductor die to external elements, such as a printed circuit board (PCB). For example, semiconductor die 101 includes metallized die pads 102 on its active side 104. Die pads 102 may be aluminum pads or copper pads for example. The die pads may include plated bumps, such as copper plated bumps on copper pads. Active side 104 of semiconductor die 101 is protected by an electrically insulating layer 110 of an inert polymeric material such as polyimide, which may have been applied to a surface of a semiconductor wafer used to form semiconductor die 101 before wafer singulation. Electrically insulating layer 110 has a plurality of openings 111 to expose die pads 102.

Semiconductor package 100 further includes a layered mold 120 covering semiconductor die 101 opposite redistribution layer 140. Layered mold 120 is a dielectric that covers backside 106 of semiconductor die 101 and its sidewalls that extend between active side 104 and backside 106. Layered mold 120 includes a fiber layer 122 along backside 106 of semiconductor die 101. Fiber layer 122 separates two resin layers 124, 126. Specifically, resin layer 124 covers sides that are adjacent to active side 104 of semiconductor die 101, and resin layer 124 further covers backside 106 of semiconductor die 101. Resin layer 124 is adjacent to redistribution layer 140, fiber layer 122 is adjacent to resin layer 124 and opposite redistribution layer 140, and resin layer 126 is adjacent to fiber layer 122 and opposite redistribution layer 140. Fiber layer 122 and resin layers 124, 126 are generally planar layers in the X-Y plane and parallel to active side 104 of semiconductor die, although some variation of the planarity may occur as part of a common molding process including the layers of layered mold 120.

Redistribution layer 140 includes metal traces 142 electrically connecting die pads 102 on active side 104 of semiconductor die 101 to electrical contacts 143 on an external surface of semiconductor package 100. Electrically insulating layer 110 separates metal traces 142 from active side 104, with the exception of openings 111 at die pads 102.

Redistribution layer 140 further includes an electrically insulating layer 110 adjacent active side 104 of semiconductor die 101, electrically insulating layer 110 forming openings 111 at die pads 102 on active side 104 of semiconductor die 101. Metal traces 142 run over electrically insulating layer 110 and contact die pads 102 within openings 111 of electrically insulating layer 110. Redistribution layer 140 further includes electrically insulating layer 160 adjacent metal traces 142 opposite electrically insulating layer 110. Electrically insulating layer 160 protects a majority of the package surface and forms openings 161 at electrical contacts 143 on an external surface of semiconductor package 100. In some examples, electrically insulating layer 160 may represent a solder mask layer. Solder bumps 150 are positioned on electrical contacts 143 at openings 161 of electrically insulating layer 160 to facilitate a connection with an external device, through a solder reflow process for example. For example, solder bumps 150 may form a ball grid array. In other examples, a semiconductor package may include different terminal configurations, including but not limited to land grid arrays, or QFN-type (Quad Flat No-Lead) package terminals.

Semiconductor package 100 provides a fan-out configuration in that electrical contacts 143 on external surface of semiconductor package 100 form an array covering an area larger than die pads 102 on active side 104 of semiconductor die 101. For example, as shown in FIG. 1B, semiconductor die 101 width 138 is smaller than solder bump 150 array width 139. Other examples are also contemplated, such as fan-in configurations or other CSPs.

Resin layers 124, 126 have substantially different coefficients of thermal expansion (CTE) relative to one another. As used herein, CTE represents a change in length of a sample in one dimension per unit change of temperature. As used, herein substantially different means, for a given temperature or temperature range, unlike in a manner that exceeds manufacturing tolerances for resins manufactured according to common specifications. The compositions of resin layers 124, 126 may be selected to provide different CTEs that mitigate warpage of semiconductor package 100 and/or a panel array of semiconductor packages formed in a common mold with semiconductor package 100. Such warpage may be caused by asymmetric thermal expansion and contraction of the elements of semiconductor package 100 or the panel mold.

Fiber layer 122 itself provides a resistance to expansion and contraction along a plane of its fibers (referred to the X-Y plane). The fibers of fiber layer 122 may result in a lower CTE in the X-Y for fiber layer 122 than the CTEs of either of resin layers 124, 126. For example, fiber layer 122 may be a resin-glass fiber composite, such as a preimpregnated fiber layer. While relatively stable in the X-Y plane, fiber layer 122 is susceptible to bending in the Z direction. By balancing the linear thermal expansion on either side of fiber layer 122, forces from expansion and contraction offset, thereby limiting net bending forces on fiber layer 122. In this manner, warpage of semiconductor package 100 due to thermal expansion and contraction may mitigated, thereby improving the robustness of electrical connections within semiconductor package 100, and electrical connections between semiconductor package 100 and an external substrate, such as PCB.

Fiber layer 122 is a composite that includes resin and fibers. The components of fiber layer may be selected according to the design a performance requirements for semiconductor package 100, including operating temperature ranges, cooling requirements, and required dielectric properties. In addition, the components of fiber layer 122 may be selected such that a CTE of fiber layer 122 in the X-Y plane is similar to a CTE of semiconductor die 101.

In some examples, fiber layer 122 is a pre-impregnated fiber layer 122. In the same or different examples fiber layer 122 may include glass fibers, such as an oxide of silicon, such as silicon dioxide (silica). In the same or different examples, fiber layer 122 may include a woven fiber, such as a woven glass fiber. In other examples, fiber layer may include randomly oriented fibers and/or continuous strand fibers. In any event, the fibers of fiber layer 122, extend generally along the X-Y plane in that the fibers remain within the thickness 132 of fiber layer 122. Due to orientation of fibers in fiber layer 122 within the X-Y plane, fiber layer 122 may exhibit a higher CTE in the Z direction than within the X-Y plane.

In contrast, resin layers 124, 126 are essentially free of fibers, although they may still include other fillers. Being essentially free of fibers allows resin layers 124, 126 to conform to the shape of semiconductor die 101 and a mold cavity in which layered mold 120 is formed more freely than the generally planar fiber layer 122.

The resins of fiber layer 122 and resin layers 124, 126 may include epoxy resins, polyurethane resins, and/or silicone resins. In some examples, each of fiber layer 122 and resin layers 124, 126 may include a common base, such as an epoxy resin, polyurethane resin, or silicone resin. In other examples, fiber layer 122 and resin layers 124, 126 may include different resin bases, such as different varieties of epoxy resins, polyurethane resins, or silicone resins, or a mixture of epoxy resins, polyurethane resins, and/or silicone resins.

The resins of fiber layer 122 and resin layers 124, 126 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, increase thermal conductivity, increase elastic modulus of the mold compound compared to the resin base. Particulate fillers may be selected to reduce strength characteristics such as tensile strength and flexural strength compared to the resin base materials.

The compositions of resin layers 124, 126 may be selected to provide different CTEs to mitigate warpage of semiconductor package 100 and/or a panel array of semiconductor packages formed in a common mold with semiconductor package 100 during manufacturing, installation and operation. For example, a primary source of warpage is temperature variations during manufacturing processes, including before or after singulation, or operation of semiconductor package 100. In a semiconductor package having a homogenous mold compound instead of layered mold 120, the mold compound would generally be expected to have a higher CTE than that of the silicon die. For that reason, a side of the semiconductor package including the silicon die would expand less under temperature increases and contract less under temperature decreases that a side of the semiconductor package that only includes the mold compound. Such varying rates of CTE on opposite sides of a semiconductor package can lead to asymmetric thermal expansion and undesirable warpage. For example, warpage may fracture internal conductors of a semiconductor package, such as metal traces 142 and/or fracture electrical connections between the semiconductor package and an external substrate, such as a PCB. In addition, warpage of a panel array of semiconductor packages formed in a common mold with semiconductor package 100 as part of a batch process may interfere with process steps during manufacture of the packages.

In order to mitigate warpage of semiconductor package 100, the CTE of resin layer 124, which is adjacent semiconductor die 101, may be higher than the CTE of resin layer 126, which is on the opposite side of fiber layer 122 relative to resin layer 124. More specifically, the composition of resin layer 126 may be selected to provide a similar rate of linear thermal expansion as the combined rate of linear thermal expansion of semiconductor die 101 and resin layer 124. Such a configuration may result in balancing expansion and contraction on either side of fiber layer 122 due to temperature variations and mitigate warpage of semiconductor package 100 and/or a panel array of semiconductor packages formed in a common mold with semiconductor package 100. Accordingly, in some examples, the CTE of resin layer 126 is between the CTE of semiconductor die 101 and the CTE of resin layer 124. In the same or different examples, the CTE of resin layer 124 is at least 120 percent of the CTE of resin layer 126. A CTE variance of at least 120 percent result from intentional differences in the compositions of resin layers 124, 126 and provide variation sufficient to limit asymmetric thermal expansion and contraction of semiconductor package 100 and/or a panel array of semiconductor packages formed in a common mold with semiconductor package 100.

In specific examples, the CTE of a silicon wafer, such as a silicon wafer used in the manufacture of semiconductor die 101, may between 2 and 4 parts per million per degree Celsius (ppm/° C.), such as about 2.6 ppm/° C. as measured below the glass transition temperature of silicon. In the same or different examples, the CTE of resin layer 124 may be between 50 and 100 ppm/° C., and CTE of resin layer 126 may be between 10 and 40 ppm/° C. over similar temperature ranges. While other ranges are contemplated, these ranges are suitable to limit asymmetric thermal expansion and contraction when combined with the CTE of semiconductor die 101. These ranges can also be readily obtained by varying proportions of common bases and fillers, such as epoxy resins and silica fillers.

One technique to adjust the CTE of resin layers 124, 126 is to change the content or the composition of fillers in the resin. For example, a CTE of an epoxy resin base without fillers may be between 50 and 100 ppm/° C., while adding up to 50 percent by weight silica fillers may reduce its CTE to within a range of 20 to 50 ppm/° C. Similar results may occur with other resin bases and/or filler materials, and any number of material compositions may be suitable for a given application. In order to provide a higher CTE for resin layer 124 compared to resin layer 126, resin layer 124 may include a lower proportion of filler by weight than resin layer 126.

Figure 4A:
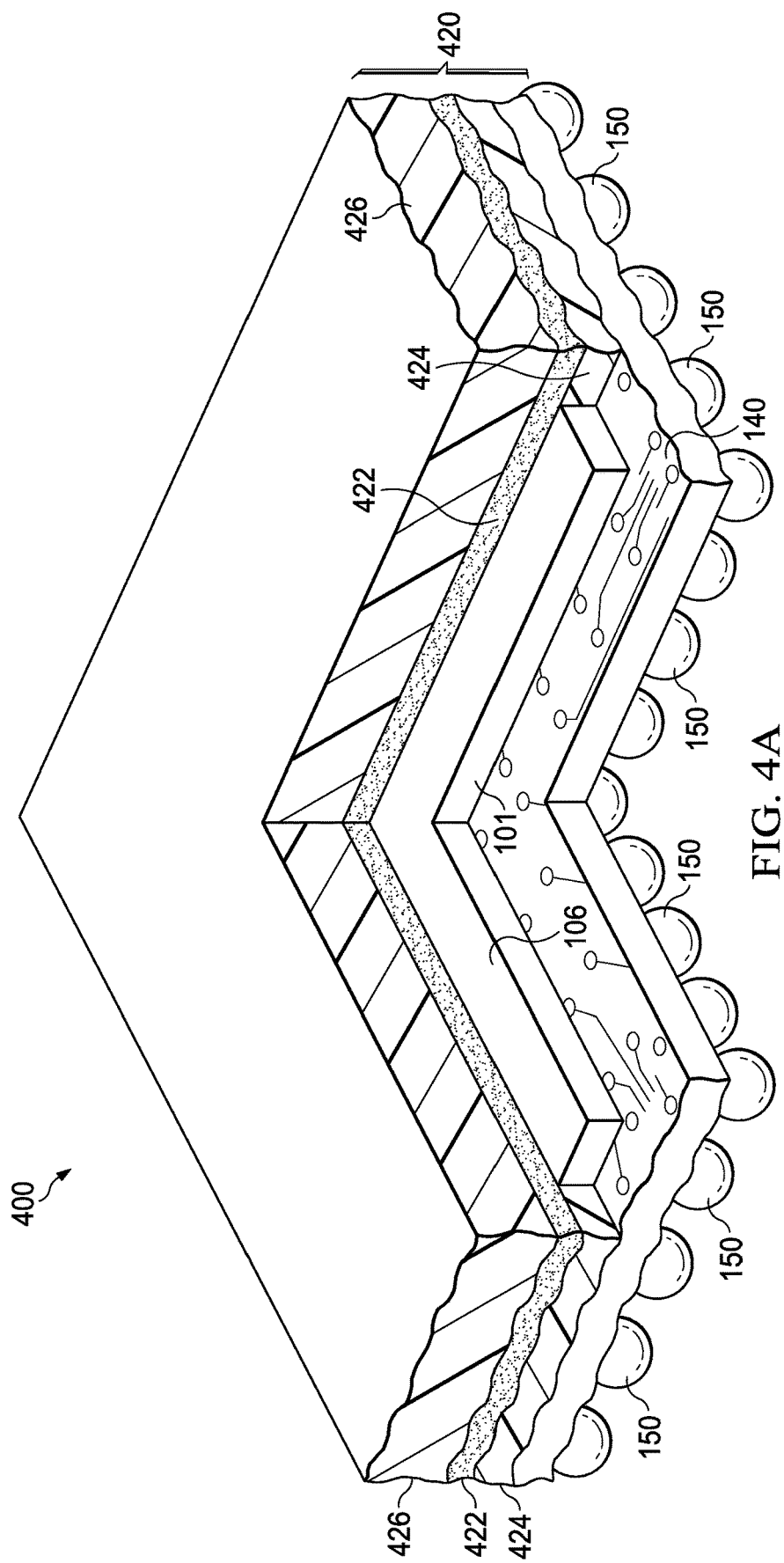
FIG. 4A is a cut-away perspective view of another semiconductor package including a semiconductor die, a redistribution layer over an active side of the semiconductor die, and a layered mold covering the semiconductor die opposite the redistribution layer.
Figure 4B:
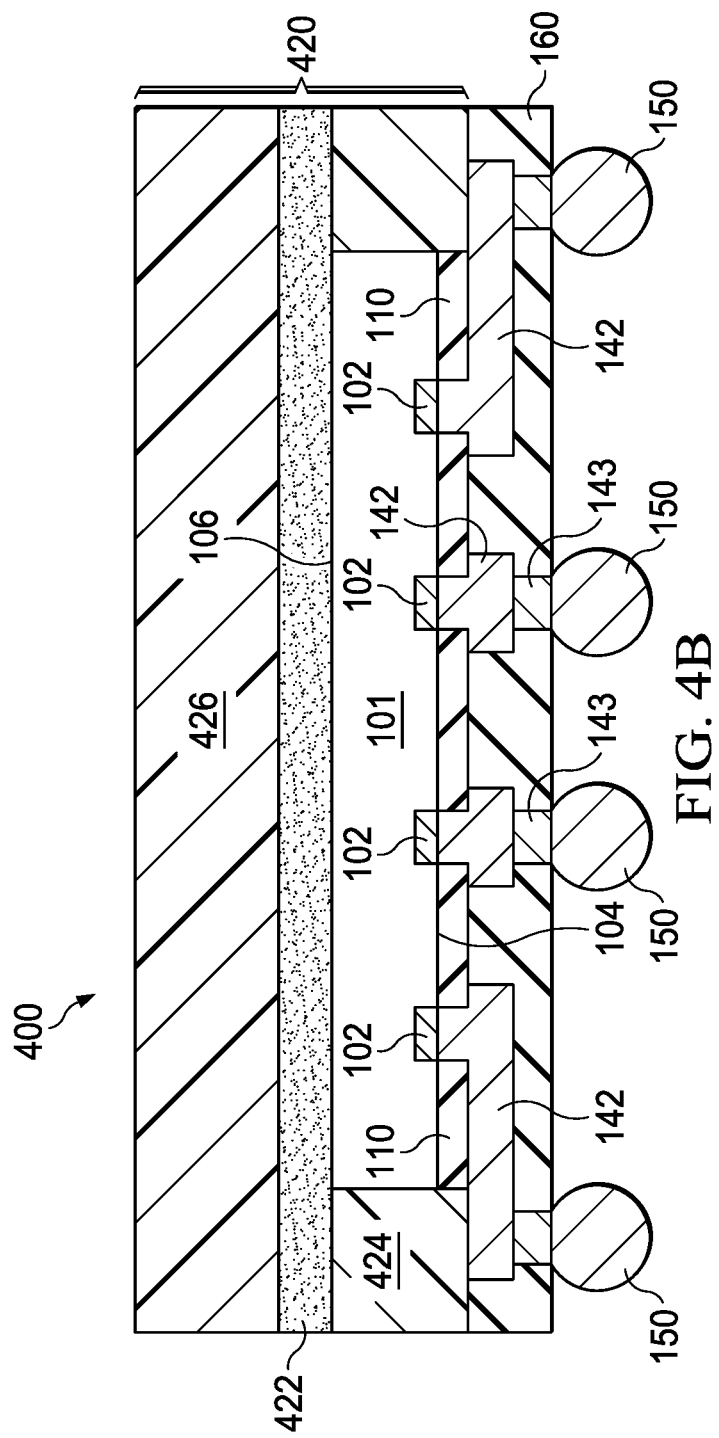
FIG. 4B is a conceptual cross-sectional diagram of the semiconductor package of FIG. 4A.

The composition of fiber layer 122 may be selected to provide a CTE similar to that of semiconductor die 101. While resin layer 124 covers backside 106 in semiconductor package 100, resin layer 124 may be relatively thin such that it tends to conform to fiber layer 122. In other examples, fiber layer 122 may be in contact with backside 106 of semiconductor die 101, as described with respect to semiconductor package 400 (FIGS. 4A and 4B). For example, the CTE of fiber layer 122 may be within 25 percent of the CTE of semiconductor die 101, such as within 10 percent of the CTE of semiconductor die 101. Designing fiber layer 122 to have a CTE close to that of semiconductor die 101 may mitigate cracking and separation between fiber layer 122 and backside 106 of semiconductor die 101 caused by thermal expansion and/or contraction.

In addition to the material composition of fiber layer 122 and resin layers 124, 126, the thicknesses of the layers of layered mold 120 may be selected to mitigate warpage by limiting asymmetric thermal expansion and contraction. The thicknesses shown in FIG. 1B represent distances measured in the Z dimension, which is perpendicular to active side 104 of semiconductor die 101. Thickness 134 of semiconductor die 101 may be about 100 micrometers, although the thickness of semiconductor die 101 may be selected to be less than or greater than 100 micrometers, such as within a range of 30 micrometers to 1000 micrometers. Thickness 134 of semiconductor die 101 may also correspond to the thickness of resin layer 124, or resin layer 124 may cover backside of semiconductor die 101 with a relatively thin thickness 135. For example, thickness 135 of resin layer 124 over backside 106 may be less than thickness 132 of fiber layer 122. Generally, the total thickness of semiconductor package may range between 150 percent to 300 percent thickness 134 of semiconductor die 101, such as about twice thickness 134 of semiconductor die 101.

Thickness 132 of fiber layer 122 may be selected according to the desired strength of fiber layer 122. A thicker fiber layer 122 may provide additional structure and stability to semiconductor package 100; however, it is generally preferable to limit the overall package thickness. For example, in some examples, thickness 132 of fiber layer 122 may be less than thickness 136 of resin layer 126. Thickness 132 of fiber layer 122 may also be less than thickness 134 of semiconductor die 101. In the same or different examples, a combined thickness 132, 136 of fiber layer 122 and resin layer 126 is less than thickness 134 of semiconductor die 101 as measured perpendicular to active side 104 of semiconductor die 101. Precise thicknesses and ranges are not germane to this disclosure as the specific thicknesses selected for the layers of layered mold 120 will be particular to a given application, and variations to the described examples are contemplated.

The techniques disclosed with respect to layered mold 120 may be particularity applicable to packages without discrete substrates or leadframes, which might otherwise provide rigidity, such as fan-out packages, fan-in packages, and chip scale packages. The disclosed techniques may also be particularity applicable to panelized package manufacturing techniques in which a plurality of semiconductor dies 101 are manufactured on a common carrier, such as a carrier of at least 12 inches by 12 inches.

Additional techniques in which a plurality of semiconductor dies 101 are manufactured on a flexible common carrier are disclosed with respect to FIGS. 2A-2J and FIG. 3. Utilizing a flexible carrier rather than a stiff carrier during panelized package manufacturing may mitigate stress on the semiconductor packages during removal of the carrier from a molded set of semiconductor packages forming a panel. Manufacturing techniques including a flexible common carrier may be used in the manufacture of with semiconductor packages including a layered mold, such as semiconductor package 100, or in the manufacture other semiconductor packages, such as semiconductor packages including a single type of mold compound rather than a layered mold.

FIGS. 2A-2J are conceptual illustrations of manufacturing steps for a semiconductor package. FIG. 3 is a flowchart illustrating a method of forming a semiconductor package including a layered mold. For clarity, the techniques of FIG. 3 are described with respect to semiconductor package 100 and FIGS. 2A-2J; however, the described techniques may also be utilized in the manufacture of other semiconductor packages, including those with or without layered molds.

Figure 2A:
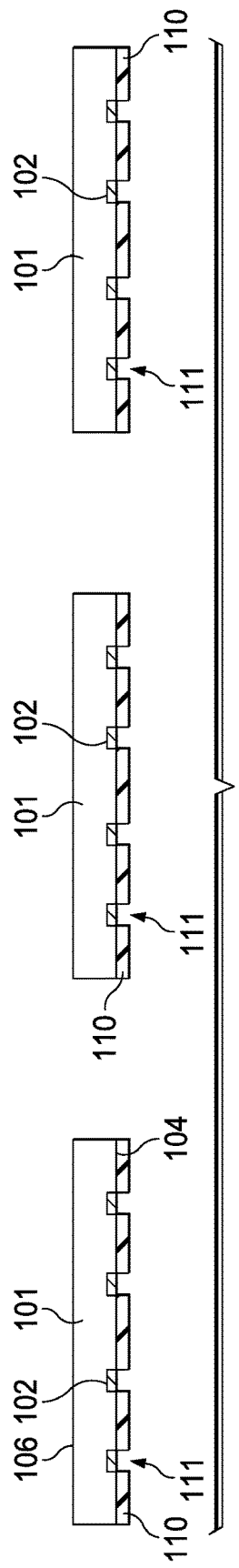
Figure 3:
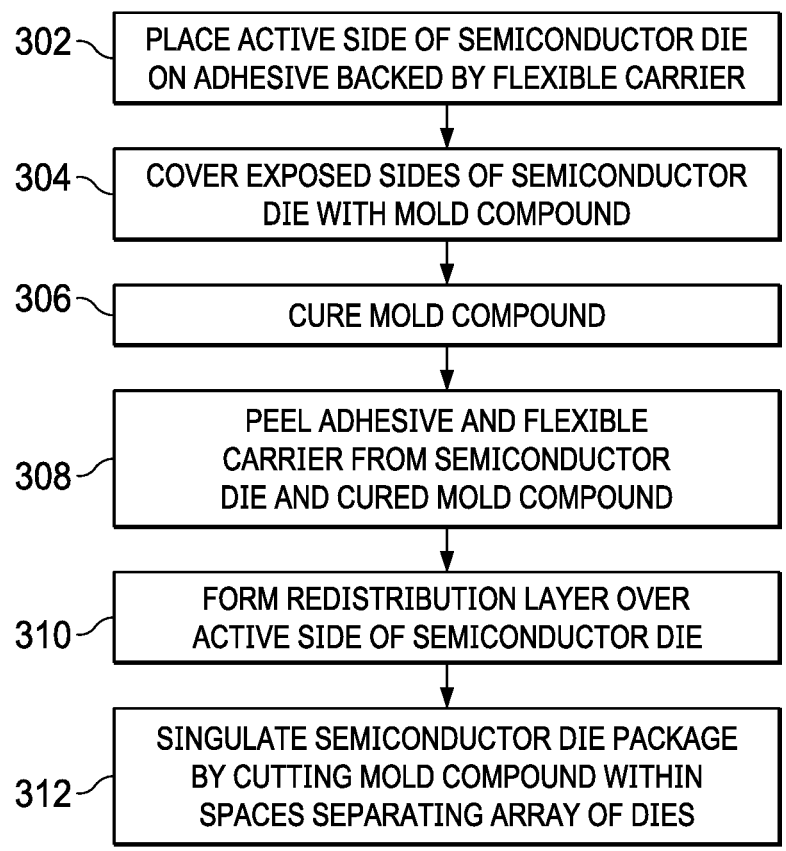
FIG. 3 is a flowchart illustrating a method of forming a semiconductor package, such as the semiconductor package of FIG. 1A.

A plurality of singulated semiconductor dies 101 are shown in FIG. 2A. Each semiconductor die 101 includes active side 104 with die pads 102, which serve as terminals for the active and/or passive elements of each semiconductor die 101. Backside 106 is on the opposing surface of each semiconductor die 101 relative to active side 104. Active side 104 of semiconductor die 101 is protected by an electrically insulating layer 110 of an inert polymeric material such as polyimide, which has been applied to the surface of the semiconductor wafer before wafer singulation. Electrically insulating layer 110 was patterned to form a plurality of openings 111 to expose die pads 102. Following the patterning of insulating layer, the wafer was diced to form singulated semiconductor dies 101.

Figure 2B:
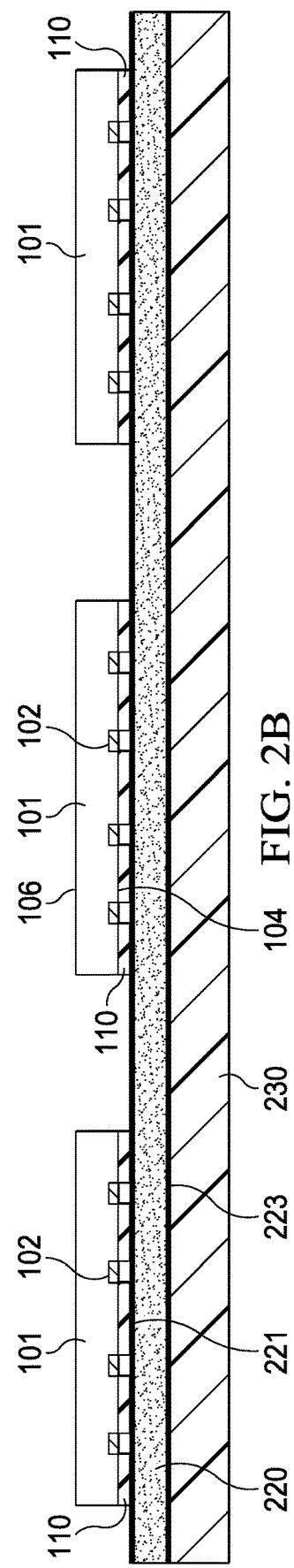

As shown in FIG. 2B, for each semiconductor die 101, active side 104 is placed on an adhesive 220 backed by a flexible carrier 230 to secure semiconductor die 101 to flexible carrier 230 (step 302, FIG. 3). Flexible carrier 230 provides support for each semiconductor die 101 during molding. The semiconductor dies 101 are spaced from one another in a grid or a strip on flexible carrier 230. While only three semiconductor dies 101 are illustrated in FIGS. 2A-2J, flexible carrier may be sized to hold dozens or hundreds of semiconductor dies 101 in a grid.

Adhesive 220 functions to hold each semiconductor die 101 in precise positions on flexible carrier 230 during molding processes, such as placement within a mold cavity of a transfer mold press, and during molding itself. Each semiconductor die 101 oriented so that die pads 102 adhesive 220 and electrically insulating layer 110 is attached to adhesive 220. In this position, die pads 102 are protected from external influences and can thus conserve their original cleanliness. In some examples, as discussed with respect to semiconductor package 500 (FIGS. 5A and 5B), a stiff frame, such as an organic or metal frame, such as a stainless steel, aluminum, or copper frame, may also be placed on adhesive 220, with semiconductor dies 101 located within windows of the frame.

In any event, the size of flexible carrier 230 and the corresponding array of semiconductor dies 101 defines a panel size for processing. A panel may be larger than a wafer used to form semiconductor dies 101. For example, a panel may be 16 inches by 20 inches or larger. Such panel-based manufacturing techniques support a batch process volume in excess of that manufacturing techniques practiced directly on a smaller sized wafer.

In the illustrated example, adhesive 220 is a double-sided adhesive tape, including tacky adhesive layer 221 facing dies 101, and adhesive layer 223 facing flexible carrier 230. In some examples, adhesive 220 may be a silicone-based adhesive tape.

In some examples, flexible carrier 230 may be an organic flexible carrier, such as a thin organic substrate, having a thickness in the range of 50 to 500 micrometers, such as in the range of 100 to 200 micrometers, such as about 150 micrometers. Various organics may be used for organic flexible carrier including polymers laminates, such epoxies, such as homogeneous laminates or composite laminates. In one particular example, flexible carrier 230 may be a composite including a woven glass fiber and an epoxy resin binder.

As shown in FIG. 2C, with semiconductor die 101 secured to flexible carrier 230, exposed sides of semiconductor dies 101 are covered with a mold compound within a common mold cavity, such as a mold cavity of a transfer mold press (step 304, FIG. 3). The mold compound is cured to secure the mold compound to the semiconductor die 101 (step 306, FIG. 3). In the case of a panelized process, the mold compound covers a plurality semiconductor dies 101 positioned on flexible carrier 230 in a batch process to form panel 250. Following molding, panel 250 is generally planar although it is an option to use a leveling or grinding technique opposite flexible carrier 230 to achieve desired planarity.

In some examples, forming the mold over the semiconductor dies 101 may include a layered mold such as layered mold 120, including resin layer 124, fiber layer 122 and resin layer 126, as discussed with respect to FIGS. 1A and 1B. Each of the mold layers extend across the plurality semiconductor dies 101 positioned on flexible carrier 230. In such examples, curing the mold compound to secure the mold compound to semiconductor die 101 may include curing resin layer 124, fiber layer 122 and resin layer 126 simultaneously within a common mold cavity, such as by a transfer mold process. The CTE of resin layer 124 is substantially different than the CTE of resin layer 126 in order to mitigate warpage of panel 250 due to thermal expansion and contraction of its elements during the manufacturing process, including molding, cooling following molding and metal sputtering, package singulation, and other manufacturing steps.

As shown in FIG. 2D, adhesive 220 and flexible carrier 230 are peeled from panel 250, which includes cured mold compound and semiconductor dies 101, to remove adhesive 220 and flexible carrier 230 from panel 250 (step 308, FIG. 3). The relatively thin and flexible properties of flexible carrier 230 allow an auto tape remover commonly used in panel batch processing to remove adhesive 220 and flexible carrier 230 from panel 250 by peeling. Adhesive layer 223 may provide a stronger level of adhesion to flexible carrier 230 than adhesive layer 221 to panel 250 to facilitate the removal of adhesive 220 in combination with flexible carrier 230 from panel 250.

In some examples, adhesive 220 may be an ultraviolet release adhesive or thermal release adhesive such as an ultraviolet release tape or a thermal release tape. In such examples, peeling of adhesive 220 and flexible carrier 230 may include first weakening the adhesive properties of adhesive 220 by applying ultraviolet light or heat to the assembly including the cured mold compound, semiconductor dies 101, adhesive 220 and flexible carrier 230 prior to or in conjunction with peeling adhesive 220 and flexible carrier 230 from panel 250. In other examples, the tackiness of adhesive layer 221 allows removal by simply peeling and without additional treatments.

FIG. 2E illustrates panel 250 following the removal of adhesive 220 and flexible carrier 230 from panel 250. FIGS. 2F to 2H illustrate the formation of a redistribution layer 140 over each active side 104 of the semiconductor dies 101 of panel 250 (step 310, FIG. 3). Once complete, redistribution layer 140 including metal traces 142 electrically connecting die pads 102 on active side 104 of semiconductor die 101 to electrical contacts 143 on an external surface of semiconductor package 100.

As shown in FIG. 2F, metal traces 142 are formed over electrically insulating layer 110 and the exposed die pads 102 within openings 111 of electrically insulating layer 110. For example, metal traces 142 may be sputtered metal. In some examples, sputtering includes the sputtering of a first layer of a metal selected from a group including titanium, tungsten, tantalum, zirconium, chromium, molybdenum, and alloys thereof, wherein the first layer is adhering to chip and lamination surfaces; and without delay sputtering at least one second layer of a metal selected from a group including copper, silver, gold, and alloys thereof, onto the first layer, wherein the second layer is adhering to the first layer. The sputtered layers may provide uniformity, adhesion, and low resistivity to function as conductive traces for rerouting; the sputtered layers may also serve as seed metal for plated thicker metal layers, such as electrical contacts 143.

As shown in FIG. 2G, electrically insulating layer 160 is formed over metal traces 142. Electrically insulating layer 160 protects a majority of the package surface and forms openings 161 at electrical contacts 143 on an external surface of semiconductor package 100. In some examples, electrically insulating layer 160 may represent a solder mask layer.

As shown in FIG. 2H, for each semiconductor die 101 of panel 250, solder bumps 150 are positioned on electrical contacts 143 at openings 161 of electrically insulating layer 160 to facilitate a connection with an external device, through a solder reflow process for example. In some examples, a thicker plated metal may first be applied to metal traces 142 at openings 161 to form electrical contacts 143.

FIGS. 2I and 2J illustrate singulation of the plurality of semiconductor packages 100 from panel 250 (step 312, FIG. 3). Semiconductor packages 100 are formed by cutting within spaces 270 between semiconductor dies 101 and the corresponding solder bumps. Cutting may include sawing through the common mold of panel 250 and through the common electrically insulating layer 160. Sawing may include cuts along a grid such that each semiconductor packages 100 has a rectangular profile.

FIG. 4A is a cut-away perspective view of semiconductor package 400, and FIG. 4B is a cross-sectional diagram of semiconductor package 400. Semiconductor package 400 includes a semiconductor die 101, a redistribution layer 140 over an active side 104 of semiconductor die 101, and a layered mold 420 covering semiconductor die 101 opposite redistribution layer 140. Solder bumps 150 are located on electrical contracts 143 on an external surface of redistribution layer 140 The number of solder bumps 150 on semiconductor package 400 has been reduced for simplicity in FIG. 4B.

Semiconductor package 400 is substantially similar to semiconductor package 100 except that layered mold 120 has been replaced with layered mold 420. For brevity, details of semiconductor package 100 are not discussed in further detail with respect to semiconductor package 400.

Layered mold 420 is a dielectric that covers backside 106 of semiconductor die 101 and its sidewalls that extend between active side 104 and backside 106. Layered mold 420 includes a fiber layer 422 that separates two resin layers 424, 426. Specifically, resin layer 424 covers sides that are adjacent to active side 104 of semiconductor die 101. Resin layer 424 is adjacent to redistribution layer 140, fiber layer 422 is adjacent to semiconductor die backside 106 and resin layer 424 and opposite redistribution layer 140, and resin layer 426 is adjacent to fiber layer 422 and opposite redistribution layer 140. Fiber layer 422 similar to fiber layer 122 in that it is along backside 106 of semiconductor die 101 and covers semiconductor die 101, but fiber layer 422 is also adjacent to backside 106 of semiconductor die 101 rather than being separated by a separate resin layer.

In contrast to layered mold 120, fiber layer 422 of layered mold 420 is in contact with backside 106 of semiconductor die 101. In all other aspects, layered mold 420 may be considered the same as layered mold 120 with fiber layer 422 equivalent to fiber layer 122, resin layer 424 equivalent to resin layer 124, and resin layer 426 equivalent to resin layer 126. For this reason, details of layered mold 120 are not repeated with respect to layered mold 420.

Because fiber layer 422 is in contract with backside 106 of semiconductor die 101, it may be important that the CTE of fiber layer 422 within the X-Y plane is similar to the CTE of semiconductor die 101. For example, the CTE of fiber layer 422 may be within 25 percent of the CTE of semiconductor die 101, such as within 10 percent of the CTE of semiconductor die 101. Designing fiber layer 422 to have a CTE close to that of semiconductor die 101, such as within these ranges, may mitigate cracking and separation between fiber layer 422 and backside 106 of semiconductor die 101 caused by thermal expansion and/or contraction.

Figure 5A:
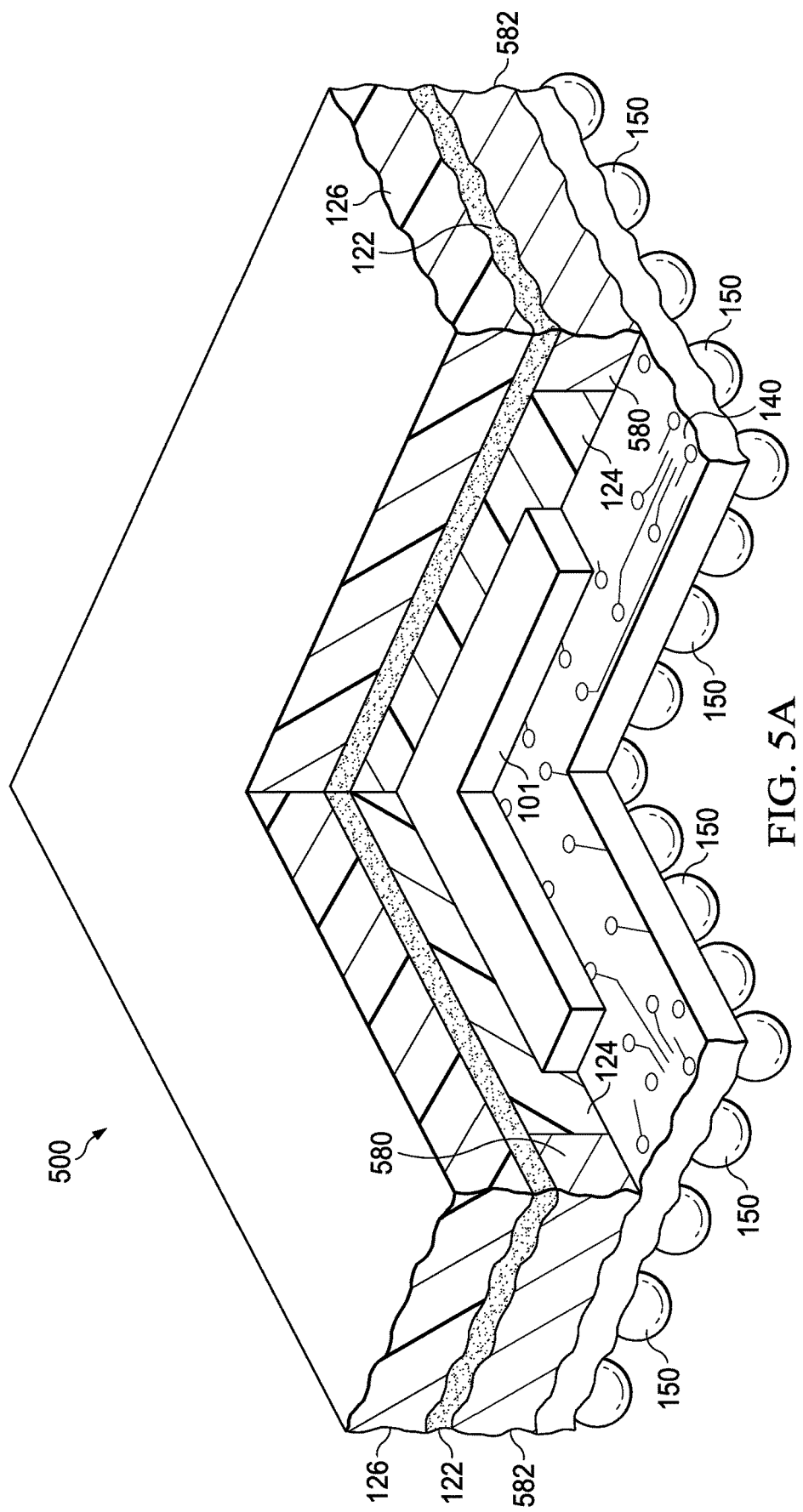
FIG. 5A is a cut-away perspective view of a semiconductor package including a semiconductor die within a frame, a redistribution layer over an active side of the semiconductor die, and a layered mold covering the semiconductor die opposite the redistribution layer.
Figure 5B:
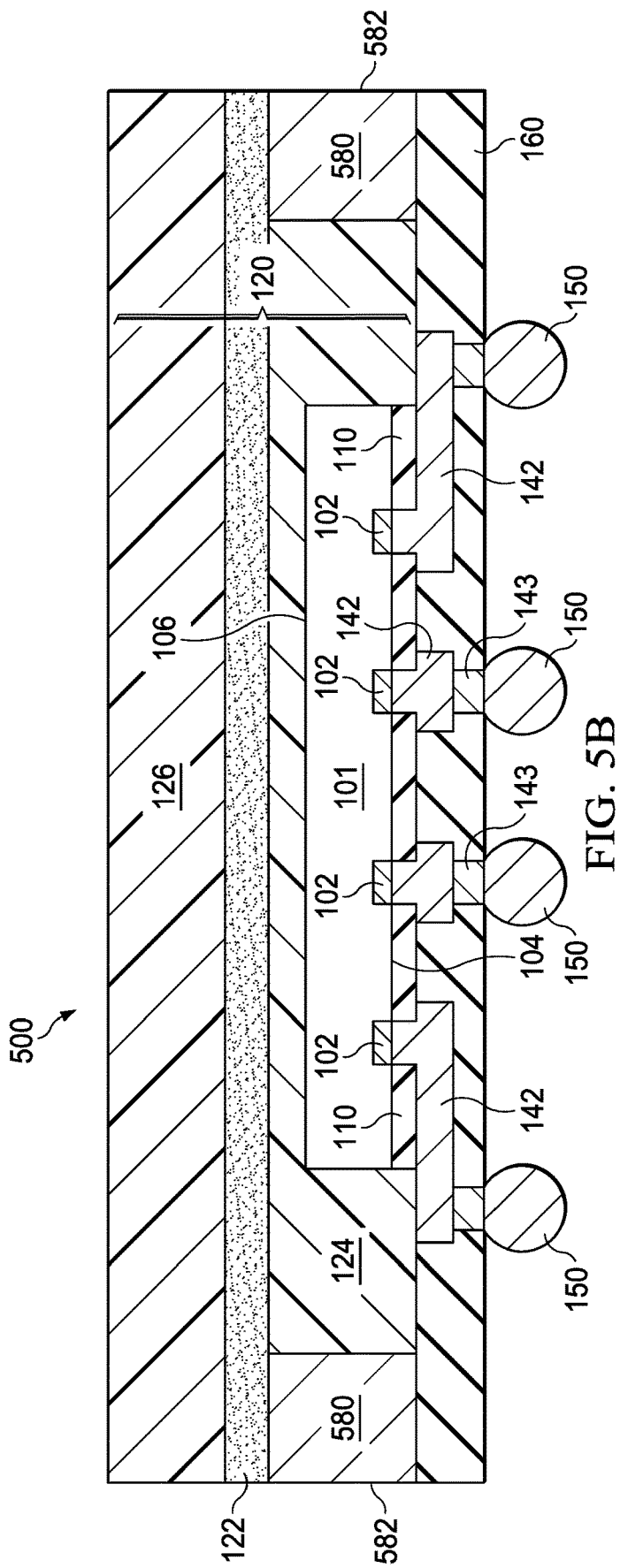
FIG. 5B is a conceptual cross-sectional diagram of the semiconductor package of FIG. 5A.

FIG. 5A is a cut-away perspective view of semiconductor package 500, and FIG. 5B is a cross-sectional diagram of semiconductor package 500. Semiconductor package 500 includes a semiconductor die 101, a redistribution layer 140 over an active side 104 of semiconductor die 101, and a layered mold 120 covering semiconductor die 101 opposite redistribution layer 140. Solder bumps 150 are located on electrical contracts 143 on an external surface of redistribution layer 140 The number of solder bumps 150 on semiconductor package 500 has been reduced for simplicity in FIG. 5B.

Semiconductor package 500 is substantially similar to semiconductor package 100 with the addition of frame 580. For brevity, details of semiconductor package 100 are not discussed in further detail with respect to semiconductor package 500.

Frame 580 represents a rectangular frame that surrounds semiconductor die 101. Frame 580 is between redistribution layer 140 and fiber layer 122, and frame 580 forms a portion of sidewalls 582 of semiconductor package 500 adjacent to the redistribution layer 140. Frame 580 is covered by electrically insulating layer 110 and electrically insulating layer 160. Sidewalls 582 are exposed by a cutting operation during the singulation of semiconductor package 500 from a panel.

Frame 580 originates from a window frame used in a fabrication process for semiconductor package 500. The window frame includes a number of generally straight frame elements that intersect at right angles to form a grid of windows. The window frame may be secured with an adhesive (such as adhesive 220) on a carrier (such as flexible carrier 230). The fabrication process may further include locating a plurality of semiconductor dies (such as a plurality of semiconductor dies 101) on the carrier within the windows of the frame. The frame provides additional stability to the panel carrier. The plurality of semiconductor dies and the frame are positioned in a common mold cavity. A transfer mold process may be used to cover the assembly with a common mold compound, such as layered mold 120, or a homogenous mold compound. Singulation of the semiconductor packages from the common mold may include cutting through elements of the window frame. Following the singulation of the semiconductor packages from the common mold, by sawing for example, portions of the window frame are removed, but a package frame (such as frame 580) remain in each of the semiconductor packages.

Frame 580 may be formed from an organic material, such as a composite including a woven glass fiber and an epoxy resin binder, such as FR-4, a glass reinforced epoxy laminate material as defined as of the filing of this application by the National Electrical Manufacturers Association (NEMA) of Arlington, Va. In other examples, frame 580 may be formed from a metal, such as a stainless steel, aluminum, or copper alloy.

Frame 580 contributes rigidity and stability of semiconductor package 500, but, even when formed from a metal, does not contribute to die pads 102, since frame 580 is separated from semiconductor die 101 with layered mold 120 and covered with electrically insulating layer 160.

The specific techniques and examples for semiconductor packages including layered molds and the specific techniques and examples for manufacturing semiconductor packages with a flexible carrier are merely illustrative of the general inventive concepts included in this disclosure as defined by the following claims.

What is claimed is:
1. A semiconductor package comprising:
 a semiconductor die including an active side;
 a redistribution layer over the active side of the semiconductor die, the redistribution layer including metal traces electrically connecting die pads on the active side of the semiconductor die to electrical contacts on an external surface of the semiconductor package; and
 a layered mold covering the semiconductor die opposite the redistribution layer, the layered mold including:
  a first resin layer adjacent to the redistribution layer;
  a fiber layer adjacent to the first resin layer and opposite the redistribution layer; and
  a second resin layer adjacent to the fiber layer and opposite the redistribution layer,
  wherein a coefficient of thermal expansion (CTE) of the first resin layer is substantially different than a CTE of the second resin layer.

2. The semiconductor package of claim 1, wherein the first resin layer covers a backside of the semiconductor die, the backside of the semiconductor die opposing the active side of the semiconductor die.

3. The semiconductor package of claim 1,
 wherein the first resin layer covers sides that are adjacent to the active side of the semiconductor die, and
 wherein the fiber layer covers and is adjacent to a backside of the semiconductor die, the backside of the semiconductor die opposing the active side of the semiconductor die.

4. The semiconductor package of claim 1, wherein a combined thickness of the fiber layer and the second resin layer is less than a thickness of the semiconductor die as measured perpendicular to the active side of the semiconductor die.

5. The semiconductor package of claim 4, wherein a thickness of the fiber layer is less than a thickness of the second resin layer as measured perpendicular to the active side of the semiconductor die.

6. The semiconductor package of claim 5, wherein a thickness of the first resin layer over a backside of the semiconductor die, the backside of the semiconductor die opposing the active side of the semiconductor die, is less than the thickness of the fiber layer as measured perpendicular to the active side of the semiconductor die.

7. The semiconductor package of claim 1, wherein the fiber layer is a pre-impregnated fiber layer.

8. The semiconductor package of claim 1, wherein the fiber layer includes a woven glass fiber.

9. The semiconductor package of claim 1, wherein the first resin layer includes a lower proportion of filler by weight than the second resin layer.

10. The semiconductor package of claim 1, wherein the first resin layer and the second resin layer are each selected from a group consisting of:
   epoxy resins;
   polyurethane resins; and
   silicone resins.

11. The semiconductor package of claim 1, wherein a CTE of the fiber layer is within 10 percent of a CTE of the semiconductor die.

12. The semiconductor package of claim 1, wherein the CTE of the first resin layer is at least 120 percent of the CTE of the second resin layer.

13. The semiconductor package of claim 1, wherein the CTE of the second resin layer is between a CTE of the semiconductor die and the CTE of the first resin layer.

14. The semiconductor package of claim 1,
   wherein the CTE of the semiconductor die is between 2 and 4 parts per million per degree Celsius (ppm/° C.),
   wherein the CTE of the first resin layer is between 50 and 100 ppm/° C., and
   wherein the CTE of the second resin layer is between 10 and 40 ppm/° C.

15. The semiconductor package of claim 1, wherein semiconductor package provides a fan-out configuration in that the electrical contacts on the external surface of the semiconductor package form an array covering an area larger than the active side of the semiconductor die.

16. The semiconductor package of claim 1, wherein the redistribution layer includes:
   a first electrically insulating layer adjacent the active side of the semiconductor die, the first electrically insulating layer forming openings at the die pads on the active side of the semiconductor die,
   wherein the metal traces run over the first electrically insulating layer adjacent the active side of the semiconductor die and contact the die pads within the openings of the first electrically insulating layer; and
   a second electrically insulating layer adjacent the metal traces opposite the first electrically insulating layer, the second electrically insulating layer forming openings at the electrical contacts on the external surface of the semiconductor package.

17. The semiconductor package of claim 1, further comprising a frame between the redistribution layer and the fiber layer, the frame surrounding the semiconductor die and forming a portion of sidewalls of the semiconductor package adjacent to the redistribution layer.

* * * * *